United States Patent
Winer

(10) Patent No.: US 11,852,662 B2
(45) Date of Patent: Dec. 26, 2023

(54) OPEN-WIRE DETECTION FOR ANALOG DIFFERENTIAL INPUTS USING AN ALTERNATING CURRENT (AC) BIAS

(71) Applicant: Hamilton Sundstrand Corporation, Charlotte, NC (US)

(72) Inventor: Gordon Elliott Winer, Prescott, AZ (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 7 days.

(21) Appl. No.: 17/505,885

(22) Filed: Oct. 20, 2021

(65) Prior Publication Data
US 2023/0122973 A1    Apr. 20, 2023

(51) Int. Cl.
*G01R 19/00*    (2006.01)
*G01R 31/54*    (2020.01)
*G01R 19/25*    (2006.01)

(52) U.S. Cl.
CPC ..... *G01R 19/2513* (2013.01); *G01R 19/0023* (2013.01); *G01R 19/0038* (2013.01); *G01R 31/54* (2020.01)

(58) Field of Classification Search
CPC ............ G01R 19/2513; G01R 19/0023; G01R 19/003; G01R 31/54
See application file for complete search history.

(56) References Cited

U.S. PATENT DOCUMENTS

| | | | | |
|---|---|---|---|---|
| 3,916,261 A | * | 10/1975 | Zylstra | H02H 3/17 361/45 |
| 4,155,116 A | * | 5/1979 | Tawfik | G05B 23/0256 702/120 |
| 7,337,669 B2 | | 3/2008 | Nozoe | |
| 7,562,558 B2 | | 7/2009 | Horner et al. | |
| 8,922,221 B2 | | 12/2014 | Lacombe et al. | |
| 9,448,275 B2 | | 9/2016 | Wingerter | |
| 10,564,209 B2 | | 2/2020 | Hess et al. | |
| 10,830,810 B2 | | 11/2020 | Winer et al. | |
| 2007/0290674 A1 | * | 12/2007 | Bolz | G01R 31/396 324/119 |
| 2017/0336438 A1 | * | 11/2017 | Kuroda | G01C 19/5614 |
| 2018/0203035 A1 | | 7/2018 | Kuroda et al. | |

(Continued)

OTHER PUBLICATIONS

European Search Report for Application No. 22200567.0, dated Mar. 21, 2023, 6 pages.

*Primary Examiner* — Feba Pothen
(74) *Attorney, Agent, or Firm* — CANTOR COLBURN LLP

(57) ABSTRACT

Provided are embodiments for circuit for detecting an open-wire condition for a differential input. Embodiments include a sensor, and a line replaceable unit (LRU) coupled to the sensor, wherein the LRU comprises a differential amplifier to provide a sensor output. Embodiments can also include a synchronous demodulator coupled to an output of the differential amplifier through an alternating current (AC) coupling network, wherein the synchronous demodulator is configured to receive the differential amplifier output and a reference signal at the synchronous demodulator signal input and reference input, and provide a synchronous demodulator output voltage to indicate an open-wire condition. Also provided are embodiments of a method for detecting an open-wire condition for a differential input.

13 Claims, 7 Drawing Sheets

(56) References Cited

U.S. PATENT DOCUMENTS

2019/0107571 A1    4/2019  Petersen et al.
2019/0195941 A1*  6/2019  Winer .................. G01D 5/2448
2019/0245500 A1    8/2019  Hurwitz et al.

* cited by examiner

US 11,852,662 B2

OPEN-WIRE DETECTION FOR ANALOG DIFFERENTIAL INPUTS USING AN ALTERNATING CURRENT (AC) BIAS

BACKGROUND

The present invention relates to a built-in test method, and more specifically, to a built-in test method to detect an open circuit on differential analog inputs.

Built-in tests and built-in self-tests are often implemented in logic and circuits to test the conditions of a system. In aerospace applications, the tests can range from testing various connections such as harness connections between various circuits/systems, or the tests can include generating test patterns for testing complex logic. Depending on the application, the tests can be performed upon initial power-up, periodically during operation, or when initiated by an operator.

BRIEF DESCRIPTION

According to an embodiment, a circuit for detecting an open-wire condition for a differential input is provided. The circuit comprising a sensor; a line replaceable unit (LRU) coupled to the sensor, wherein the LRU comprises a differential amplifier to provide a sensor output; and a synchronous demodulator coupled to an output of the differential amplifier through an alternating current (AC) coupling network, wherein the synchronous demodulator is configured to receive the differential amplifier output and a reference signal at the synchronous demodulator signal input and reference input, and provide a synchronous demodulator output voltage to indicate an open-wire condition.

In addition to one or more of the features described herein, or as an alternative, further embodiments include using a differential amplifier that is coupled to the sensor over a hi-side connection and a lo-side connection, wherein the hi-side connection is coupled to a negative square wave rail through a first bias resistor and the lo-side connection is coupled to a positive square wave rail through a second bias resistor.

In addition to one or more of the features described herein, or as an alternative, further embodiments include indicating at least one of an open-wire condition in the hi-side connection or an open-wire condition in the lo-side connection.

In addition to one or more of the features described herein, or as an alternative, further embodiments include using a frequency of the reference signal that is equal to a frequency of the positive square wave rail.

In addition to one or more of the features described herein, or as an alternative, further embodiments include using a synchronous demodulator output voltage that is provided in a voltage range that is different than a normal operating voltage range of the circuit, responsive to detecting the open-wire condition.

In addition to one or more of the features described herein, or as an alternative, further embodiments include using a synchronous demodulator that is operable to detect the open-wire condition when the sensor is a locally-grounded source.

In addition to one or more of the features described herein, or as an alternative, further embodiments include using the synchronous demodulator that is operable to detect the open-wire condition when the sensor is a floating-differential source.

In addition to one or more of the features described herein, or as an alternative, further embodiments include using a sensor output is an alternating current (AC) signal.

In addition to one or more of the features described herein, or as an alternative, further embodiments include using a sensor output is a direct current (DC) signal.

According to an embodiment, a method for detecting an open-wire condition for a differential input is provided. The method comprises receiving, at a line replaceable unit (LRU), a signal from a sensor, wherein the LRU comprises a differential amplifier and an alternating current (AC) biasing components; and providing a differential amplifier output based on a voltage difference of inputs of the differential amplifier. The method also comprises generating a synchronous demodulator output voltage based on the differential amplifier output and a reference signal to indicate an open-wire condition; and providing the synchronous demodulator output voltage to a controller to determine the open-wire condition.

In addition to one or more of the features described herein, or as an alternative, further embodiments include receiving a sensor input at the differential amplifier over a hi-side connection and a lo-side connection, wherein the hi-side connection is coupled to a negative square wave rail through a first bias resistor and the lo-side connection is coupled to a positive square wave rail through a second bias resistor.

In addition to one or more of the features described herein, or as an alternative, further embodiments include indicating at least one of an open-wire condition in the hi-side connection or an open-wire condition in the lo-side connection.

In addition to one or more of the features described herein, or as an alternative, further embodiments include using a frequency of the reference signal that is equal to a frequency the positive square wave rail.

In addition to one or more of the features described herein, or as an alternative, further embodiments include providing the synchronous demodulator output voltage in a voltage range that is different than a normal operating voltage range of the circuit, responsive to detecting the open-wire condition.

In addition to one or more of the features described herein, or as an alternative, further embodiments include detecting the open-wire condition when the sensor is a locally-grounded source.

In addition to one or more of the features described herein, or as an alternative, further embodiments include detecting the open-wire condition when the sensor is a floating-differential source.

In addition to one or more of the features described herein, or as an alternative, further embodiments include using a sensor output that is an alternating current (AC) sinusoidal signal or a direct current (DC) signal.

According to an embodiment, a circuit for detecting an open-wire condition for a differential input is provided. The circuit comprises a sensor; a line replaceable unit (LRU) coupled to the sensor, wherein the LRU comprises a differential amplifier to provide a sensor output; and a synchronous demodulator coupled to an output of the differential amplifier through an alternating current (AC) coupling network. The synchronous demodulator can comprise a means for receiving the differential amplifier output and a reference signal; and a means for providing a synchronous demodulator output voltage to indicate an open-wire condition.

In addition to one or more of the features described herein, or as an alternative, further embodiments include a means for receiving the differential amplifier output and the reference signal that is an inverting input and a non-inverting input of the operational amplifier, wherein the inverting input receives the output from the differential amplifier and the non-inverting input receives the reference signal.

In addition to one or more of the features described herein, or as an alternative, further embodiments include a means for providing a synchronous demodulator output voltage that is the output of the operational amplifier.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

Some designs for built-in tests are unable to detect fault conditions given the limitations of the generated fault signal. For example, if a fault signal lies within the normal operating range of a system, the fault may be undetected. The undetected faults can lead to other issues such as failed systems or improper sensor readings/states that can be used to the detriment of the operator that relied on the sensor readings. The techniques described herein provide a built-in test methodology to detect an open circuit of a differential analog input by using square wave bias signals and a synchronous demodulator circuit to reliably identify faults.

In embodiments of the disclosure, the synchronous demodulator detects a signal that is at the same frequency as the reference signal and rejects signals that are at a different frequency than the reference signal. An open-circuit condition impresses the AC bias voltage on the output of the differential amplifier which is then detected by the synchronous demodulator. The synchronous demodulator produces an output signal that is proportional to the amplitude of the AC bias frequency content at the differential amplifier output which can be readily identified by a system controller.

Figure 1:
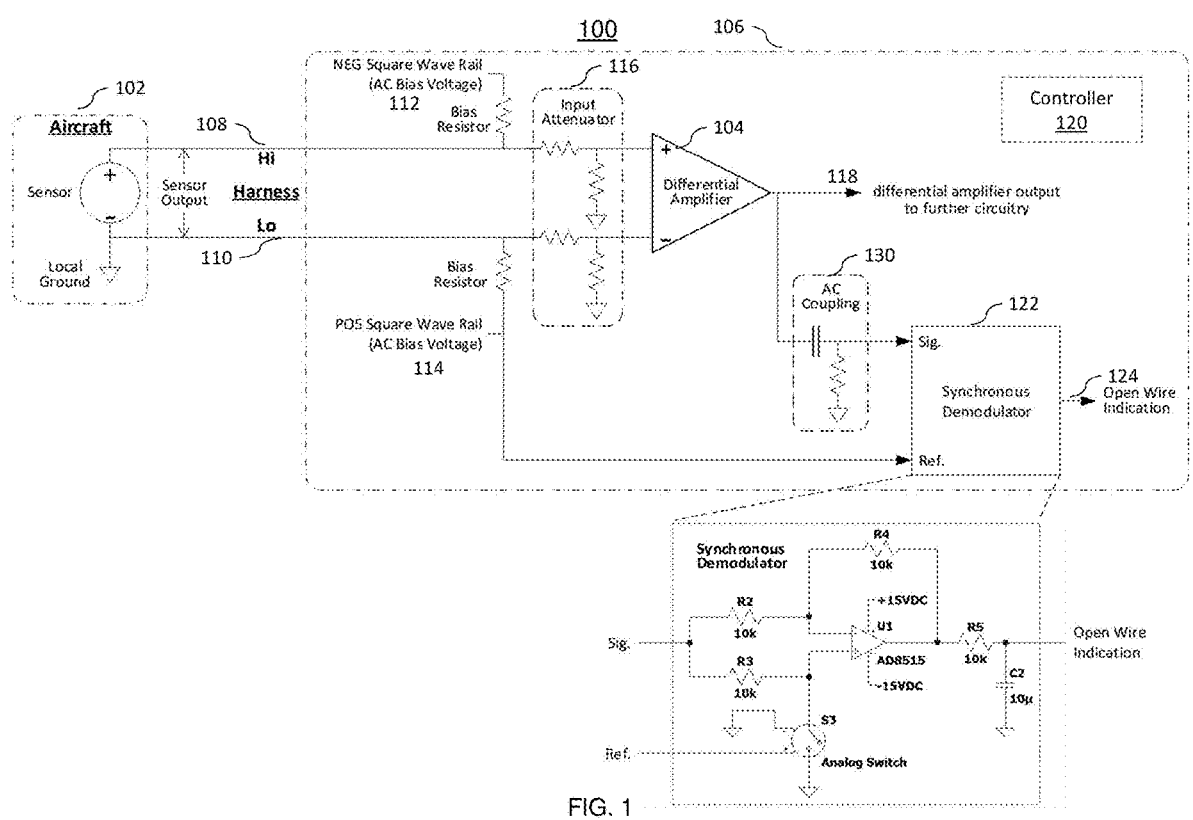
FIG. 1 illustrates a circuit for detecting an open-wire condition in accordance with one or more embodiments of the disclosure.

FIG. 1 depicts a circuit 100 that is used for open-wire detection for analog differential input using an alternating current (AC) bias in accordance with one or more embodiments of the disclosure. The circuit 100 is arranged to detect a hi-side open circuit or a lo-side open circuit. The circuit 100 includes a sensor 102 that is coupled to a differential amplifier 104 of a line replaceable unit (LRU) 106. Examples of the sensor 102 can include but is not limited to a Linear Variable Differential Transformer (LVDT), a resolver, a strain gage, or a pressure sensor. The sensor 102 is coupled to the LRU 106 over a hi-side connection 108 and a lo-side connection 110.

The hi-side connection 108 is coupled to a "Negative Square Wave Rail" 112 through a first bias resistor and the lo-side connection 110 is coupled to a "Positive Square Wave Rail" 114 through a second bias resistor. In one or more embodiments of the disclosure, the bias sources (negative square wave rail 112, positive square wave rail 114) are 180 degrees out-of-phase with each other.

An input attention circuit 116 is provided at the input to the differential amplifier 104. In this non-limiting example, the input attenuator circuit 116 includes a plurality of resistors that function as a voltage divider circuit. It should be understood that other components can be used in the input attenuator circuit 116 and are not limited by the example shown in FIG. 1.

In one or more embodiments of the disclosure, the non-inverting input of the differential amplifier 104 is coupled to the hi-side connection 108, and the inverting input of the differential amplifier 104 is coupled to the lo-side connection 110.

The differential amplifier 104 uses the difference in the voltage detected at the inverting input and the non-inverting input and provides an output 118. The output 118 from the differential amplifier 104 can be provided to a controller 120 or other circuitry (not shown) for further processing. In addition, the output 118 from the differential amplifier 118 is also provided to a synchronous demodulator 120 through an AC coupling network 130 for the open-wire detection.

In one or more embodiments of the disclosure, the synchronous demodulator 122 comprises an arrangement of a plurality of circuit components. In a non-limiting example, the synchronous demodulator 122 comprises a differential amplifier U1, where the differential amplifier U1 of the synchronous demodulator 122 comprises an inverting input, a non-inverting input, and an output. The inverting input and the non-inverting input are distinguished by the "−" and "+", respectively. The differential amplifier U1 is also coupled to the positive and negative power rails. Although, the positive and negative power rails are shown as −15 and +15 VDC, it can be appreciated the power rails can be selected based on the desired application of the sensor 102, LRU 106, and the synchronous demodulator 122.

As shown, the synchronous demodulator 122 receives the output 118 from the differential amplifier 104 through an AC coupling network 130 and receives a reference signal (ref) at the input. The inverting input of the operational amplifier/differential amplifier U1 provides a means configured to receive the output 118 (sig) from the differential amplifier 104, and the non-inverting input of the operational amplifier/differential amplifier U1 provides a means configured to receive the reference signal (ref). In one or more embodiments of the disclosure, the reference signal (ref) is clocked from the same frequency source as the bias voltage (positive square wave rail 114) used to extract square wave content at the sensor output. In one or more embodiments, the synchronous demodulator 122 where the differential amplifier U1 can be configured with gain resistors (resistors R2, R3, R4) and is further used in conjunction with the analog switch S3/reference signal, followed by a low-pass filter (resistor R5, capacitor C2), to produce a voltage that indicates an open-wire condition has been detected. The output of the differential amplifier U1 provides a means that is configured to provide a synchronous demodulator output voltage to indicate an open-wire condition to a controller 120. It should be understood that different circuit components and arrangements can be used to implement the synchronous demodulator 122 and is not intended to be limited by the illustration shown in FIG. 1.

One or more illustrative embodiments of the disclosure are described herein. Such embodiments are merely illustrative of the scope of this disclosure and are not intended to be limiting in any way. Accordingly, variations, modifications, and equivalents of embodiments disclosed herein are also within the scope of this disclosure.

Figure 2:
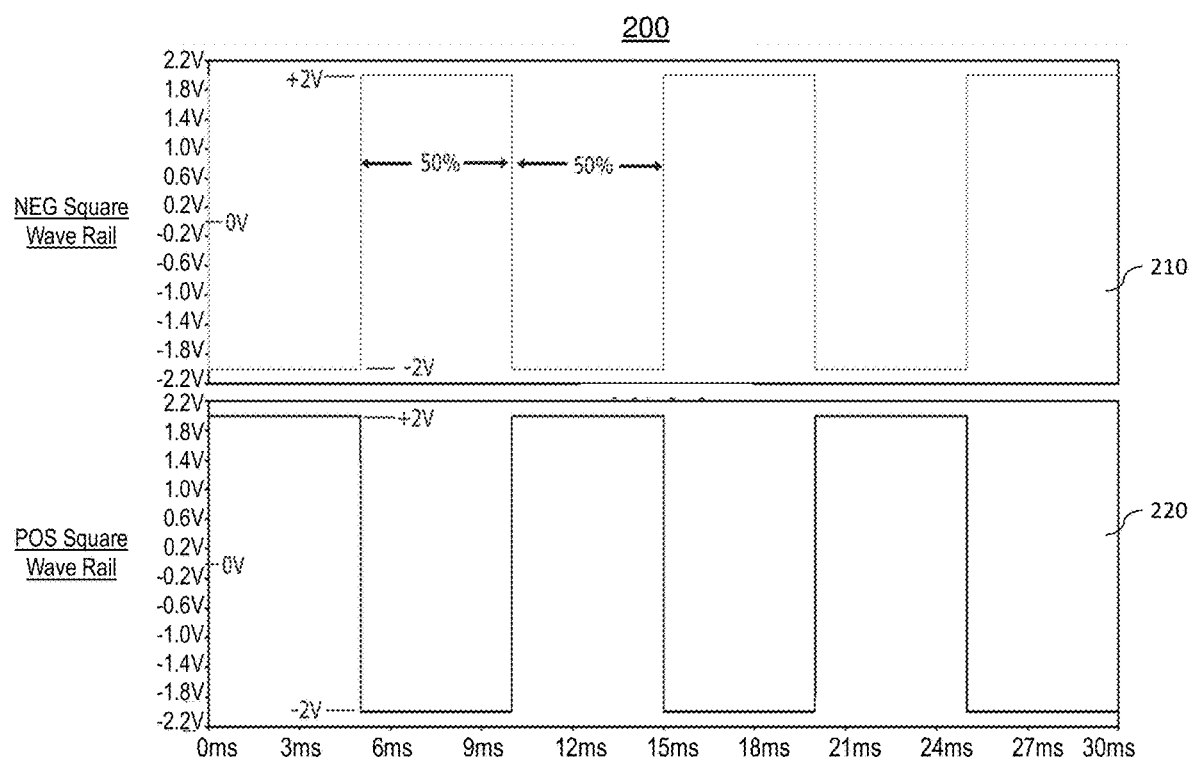
FIG. 2 illustrates the AC bias voltages used by the circuit shown in FIG. 1 to detect an open wire condition in accordance with one or more embodiments of the disclosure.

FIG. 2 illustrates an example of AC bias voltages provided to the LRU 106 of FIG. 1 to perform the open wire detection in accordance with one or more embodiments of the disclosure. The waveform 210 depicts a negative square wave that is provided to the hi-side path 108 through the first bias resistor, and the waveform 220 depicts a positive square wave that is provided to the lo-side path 110 provided through the second bias resistor. In some embodiments, the characteristics of the AC bias voltages include having equal amplitudes, symmetrical around ground (0V), 180 degrees out-of-phase, 50% duty cycle, and is approximately 10 times lower frequency than the sensor output. In this non-limiting example, each of the waveforms 210, 220 are between −2V and +2V and are complementary to each other. It can be appreciated the waveforms 210, 220 are not intended to be limiting but are provided as an illustrative example.

Figure 3:
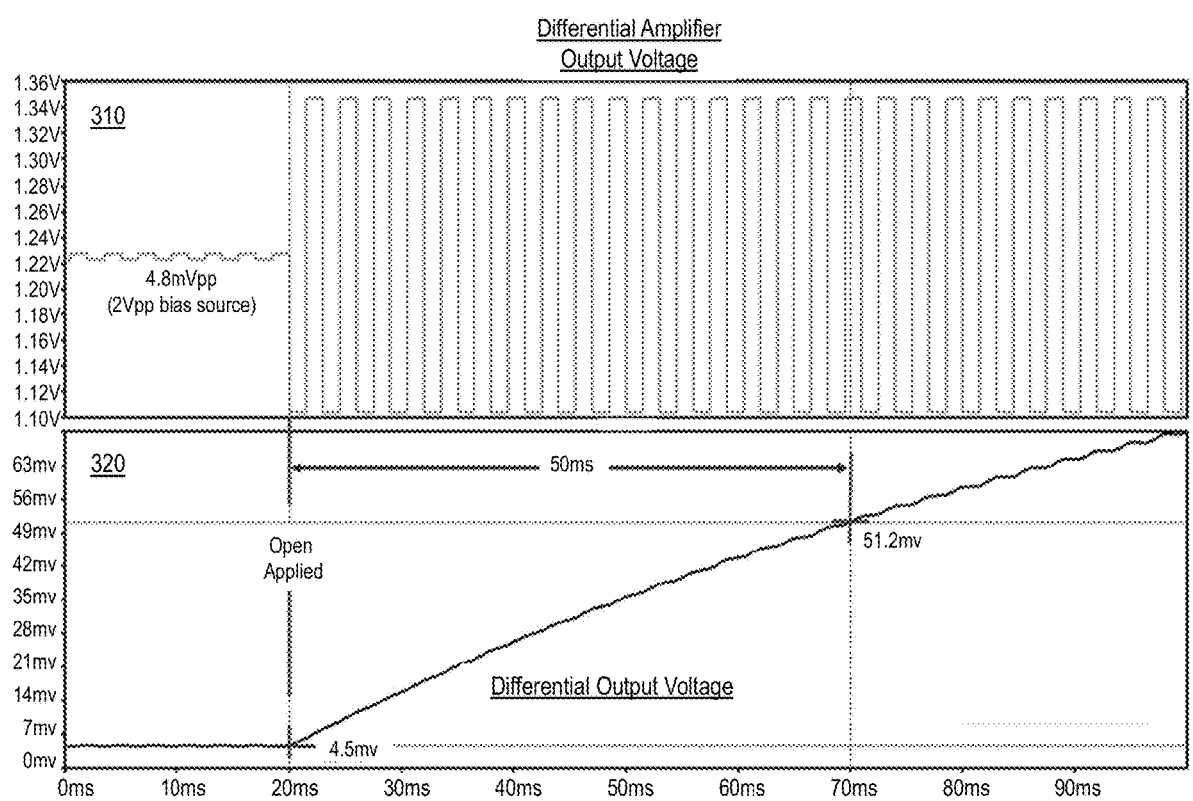
FIG. 3 illustrates timing diagrams of a detected lo-side connection open-wire condition using the circuit of FIG. 1 having a direct current (DC) sensor output in accordance with one or more embodiments of the disclosure.

FIG. 3 depicts timing diagrams for a circuit 100 having a direct current (DC) sensor output where a lo-side connection 110 open-wire condition is detected using the circuit 100 of FIG. 1. In this non-limiting example, the DC sensor output is a 5V DC signal. In one or more embodiments of the disclosure, the negative bias voltage is 180 degrees out-of-phase with the positive bias voltage. In this example, the bias voltage is 2 volts peak-to-peak ($V_{pp}$) at a frequency of 333 Hz. It should be understood that different bias voltages, different amplitudes, and frequencies can be used based on the application for the sensors.

The graph 310 represents the differential amplifier output voltage as the circuit 100 transitions from a normal operating mode (non-open-wire condition) to a fault condition (open-wire condition). The x-axis indicates the voltage ranging from 1.10V to 1.36V at the same frequency as the AC bias voltage, and the y-axis indicates time. The graph 320 represents the synchronous demodulator output voltage.

As shown, when the circuit 100 is operating in the normal operating mode the sensor output voltages provide very minimal variation in differential amplifier output caused by the square wave that is used as a bias source. When the open circuit is applied to the lo-side connection 110, the circuit impresses a significant amplitude square wave at the same frequency on the differential amplifier output. Therefore, a correspondingly large DC output from the synchronous demodulator 122 is produced. In this example, when an open-wire condition is applied to the lo-side connection 110 of the circuit 100, the differential amplifier output voltage varies between the voltage range shown and provides a significant difference in the synchronous demodulator output voltage that is approximately a 10:1 difference which can be reliably detected by the controller 120.

The synchronous demodulator output voltage increases from 4.5 mV to 51.2 mV about 50 mS after onset which can be provided to the controller 120 and be detected as an alarm. In various embodiments of the disclosure, the threshold limits to trigger an alarm (threshold voltage or time limit exceeding a threshold) can be selected to suit the application of the circuit 100.

Figure 4:
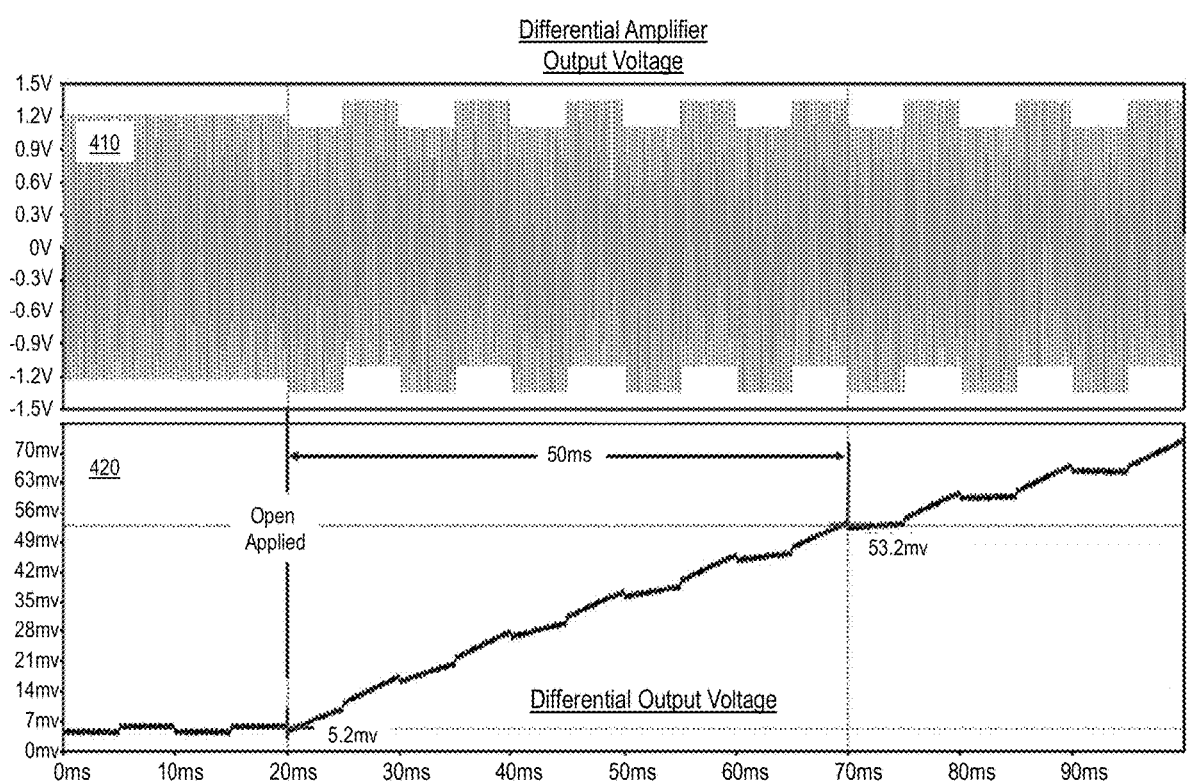
FIG. 4 illustrates timing diagrams of a detected lo-side connection open-wire condition using the circuit of FIG. 1 having an alternating current (AC) sensor output in accordance with one or more embodiments of the disclosure.

FIG. 4 depicts timing diagrams for a circuit 100 having an AC sensor output where a lo-side connection 110 open-wire condition is detected using the circuit 100 of FIG. 1. In this non-limiting example, the AC sensor output is a 5V peak, 3 kHz sinusoidal signal. The graph 410 depicts the sensor output voltage, and the graph 420 depicts the synchronous demodulator output voltage.

When the circuit 100 is operating in the normal operating mode, the sensor output voltage is provided in the range from approximately −1.2 to +1.2 V at the same frequency as the sensor output AC voltage. When the open-wire condition is applied to the lo-side connection 110, the differential amplifier output voltage is provided in the range from approximately −1.4 to +1.4 V with a high frequency carrier at the same frequency as the sensor output voltage, with a low-frequency modulation at the same frequency as the AC bias voltage. The open-wire condition causes the synchronous demodulator output voltage to increase from 5.2 mV which can be detected by the controller 120 as a fault.

Figure 5:
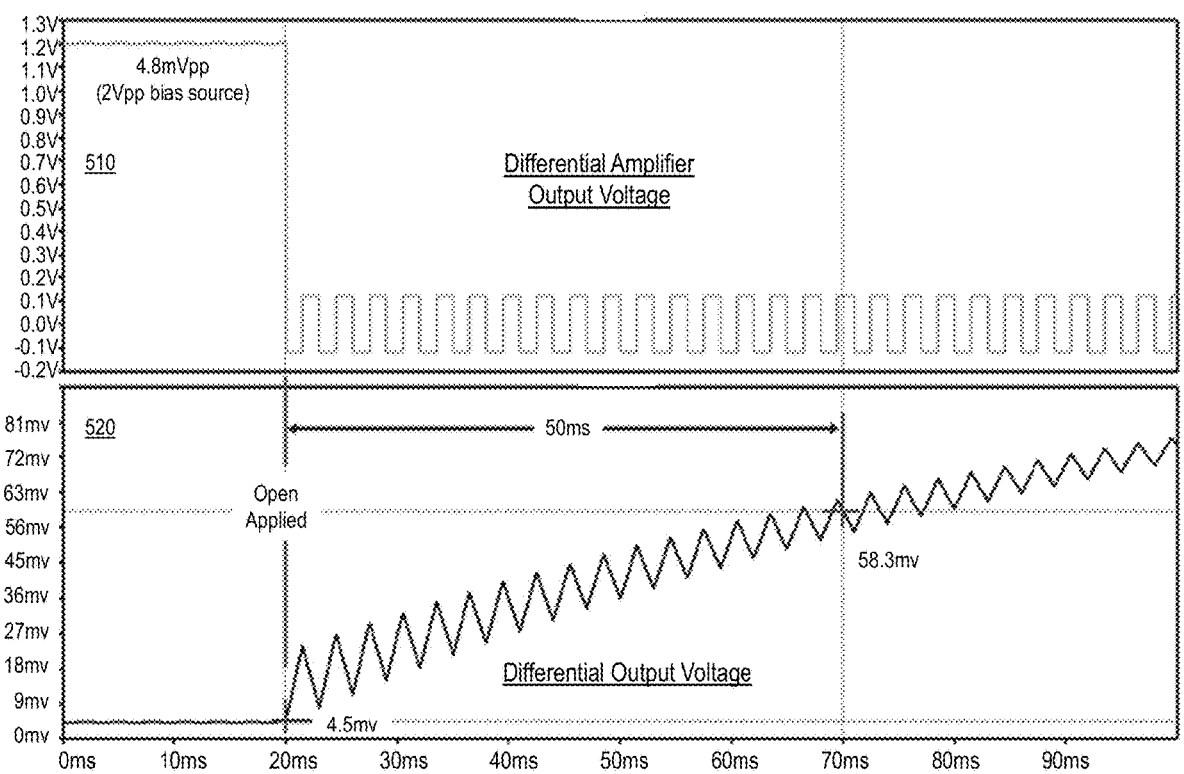
FIG. 5 illustrates timing diagrams of a detected hi-side connection open-wire condition using the circuit of FIG. 1 having a DC sensor output in accordance with one or more embodiments of the disclosure.

FIG. 5 depicts timing diagrams for a circuit 100 having a DC sensor output where a hi-side connection 108 open-wire condition is detected using the circuit 100 of FIG. 1. The graph 510 depicts the differential amplifier output voltage, and the graph 520 depicts the synchronous demodulator output voltage.

When the circuit 100 is operating in the normal operating mode, the sensor output voltage is approximate 1.2 V which includes the minimal ripple voltage of 4.8 mVpp caused by the square wave bias voltages. When the open circuit is applied to the hi-side connection 108, the differential amplifier output voltage contains a significant peak-to-peak voltage at the same frequency as the AC bias voltage which is fed to the synchronous demodulator through the AC coupling network. The open-wire condition causes the synchronous demodulator output voltage to increase from 4.5 mV which can be detected by the controller 120 as a fault.

Figure 6:
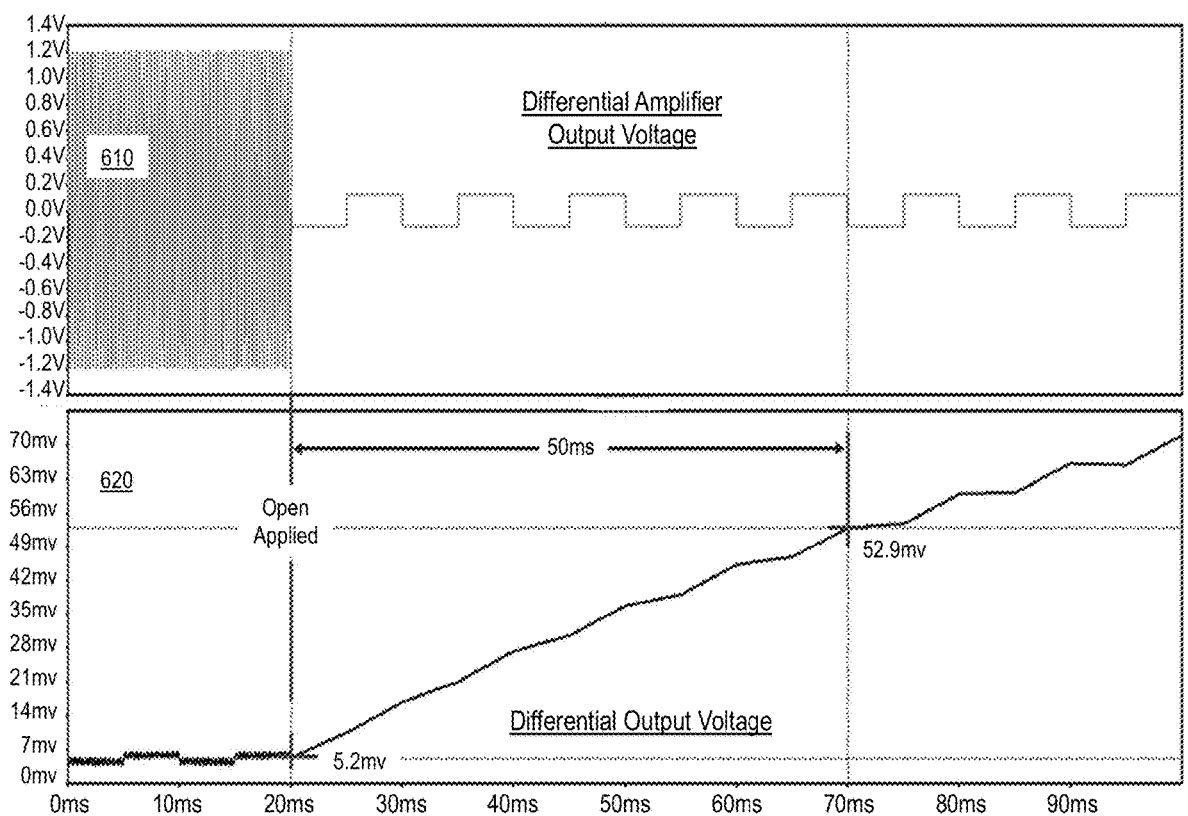
FIG. 6 illustrates timing diagrams of a detected hi-side connection open-wire condition using the circuit of FIG. 1 having an AC sensor output in accordance with one or more embodiments of the disclosure.

FIG. 6 depicts timing diagrams for a circuit 100 having an AC sensor output where a hi-side connection 108 open-wire condition is detected using the circuit 100 of FIG. 1. In this non-limiting example, the AC sensor output is a 5V peak, 3 kHz sinusoidal signal. The graph 610 depicts the sensor output voltage, and the graph 620 depicts the synchronous demodulator output voltage.

When the circuit 100 is operating in the normal operating mode, the sensor output voltage is provided in the range from approximately −1.2 to +1.2 V at the same frequency as the sensor output AC voltage with negligible frequency content at the AC bias voltage. When the open-wire condition is applied, the sensor output voltage is reduced to approximately −0.2 to +0.2 V at the same frequency as the AC bias voltage. The open-wire condition causes the synchronous demodulator output voltage to increase which can be detected by the controller 120.

Figure 7:
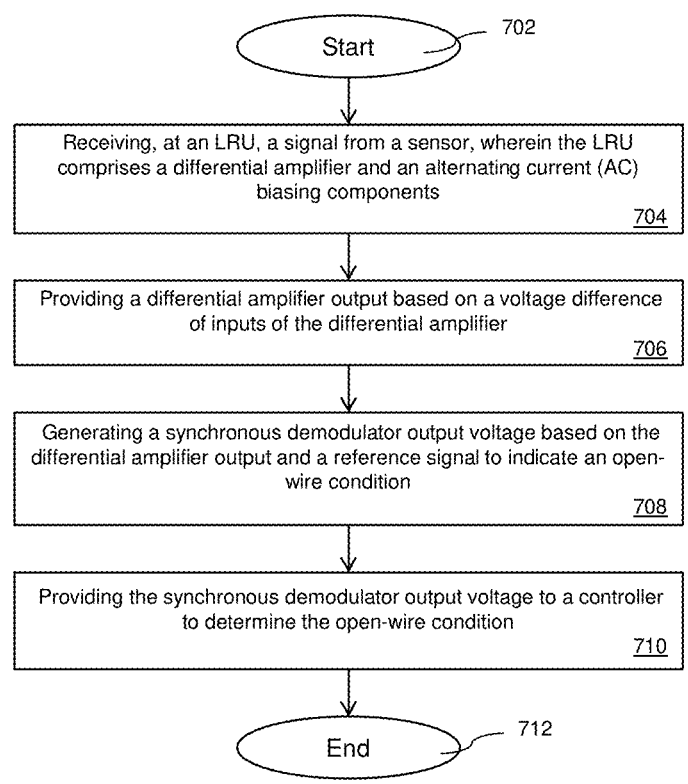
FIG. 7 illustrates a flowchart of a method for detecting an open-wire condition in accordance with one or more embodiments of the disclosure.

FIG. 7 illustrates a flowchart of a method 700 for performing open-wire detection in accordance with one or more embodiments of the disclosure. The method 700 can be performed by the circuit 100 shown in FIG. 1. The method 700 begins at block 702 and proceeds to block 704 which provides for receiving, at an LRU, signal from a sensor output, wherein the LRU comprises a differential amplifier. The sensor output can include an AC sinusoidal signal or a DC signal.

Block 706 provides a sensor output based on a difference between the inputs of the differential amplifier. In one or more embodiments of the disclosure the input of the differential amplifier receives a voltage from the hi-side connection and a lo-side connection. When a lo-side open-wire condition or a hi-side open-wire condition exists, the differential amplifier output is impacted and is provided to the synchronous demodulator through an AC coupling network. In one or more embodiments of the disclosure, the bias signal, a negative square wave and a positive square wave, is provided to the hi-side connection and the lo-side connection through resistors.

Block 708 generates a synchronous demodulator output voltage based on the differential amplifier output and a reference signal to indicate an open-wire condition. The synchronous demodulator compares the differential amplifier output to a reference signal that is the same frequency as the bias signals applied to the hi-side connection and the lo-side connection. Block 710 provides the synchronous demodulator output voltage to a controller. In one or more embodiments of the disclosure, responsive to detecting the open-wire condition, the synchronous demodulator output voltage is provided in a voltage range that is different than a normal operating voltage range of the circuit. This ensures the fault condition is detectable since it is outside of the operating range. The controller can be configured to detect the open-wire condition by comparing the synchronous demodulator output voltage to a configurable threshold. The controller is operable to detect the open-wire condition in a hi-side connection or a lo-side connection. Also, the controller is operable to detect an open-wire condition form a locally-ground sensor output and a floating-differential sensor output. The method 700 ends at block 712. It should be understood that additional steps or a different sequence of steps can be used and is not intended to be limited by the steps shown in FIG. 7.

The technical effects and benefits include detecting both hi-side connection faults and lo-side connection faults. Also, the technical effects and benefits include detecting the open circuit detection for both DC and AC sensor outputs. The technical effects and benefits include the circuit being operable to detect open conditions in both locally-grounded source and floating-differential source designs.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A circuit for detecting an open-wire condition for a differential input, the circuit comprising:
    a sensor;
    a line replaceable unit (LRU) coupled to the sensor, wherein the LRU comprises a differential amplifier to provide a sensor output; and
    a synchronous demodulator coupled to an output of the differential amplifier through an alternating current (AC) coupling network, the synchronous demodulator and including a synchronous demodulator signal input and a reference input, wherein the synchronous demodulator is configured to receive the differential amplifier output and a reference signal at the reference input, and provide a synchronous demodulator output voltage to indicate an open-wire condition;
    wherein the differential amplifier is coupled to the sensor over a hi-side connection and a lo-side connection, wherein the hi-side connection is coupled to a negative square wave rail through a first bias resistor and the lo-side connection is coupled to a positive square wave rail through a second bias resistor;
    wherein a frequency of the reference signal is equal to a frequency of the positive square wave rail.

2. The circuit of claim 1, wherein the open-wire condition indicates at least one of an open-wire condition in the hi-side connection or an open-wire condition in the lo-side connection.

3. The circuit of claim 1, wherein the synchronous demodulator output voltage is provided in a voltage range that is different than a normal operating voltage range of the circuit, responsive to detecting the open-wire condition.

4. The circuit of claim 1, wherein the synchronous demodulator is operable to detect the open-wire condition when the sensor is a locally-grounded source.

5. The circuit of claim 1, wherein the synchronous demodulator is operable to detect the open-wire condition when the sensor is a floating-differential source.

6. The circuit of claim 1, wherein the sensor output is an alternating current (AC) signal.

7. The circuit of claim 1, wherein the sensor output is a direct current (DC) signal.

8. A method for detecting an open-wire condition for a differential input, the method comprising:
    receiving, at a line replaceable unit (LRU), a signal from a sensor, wherein the LRU comprises a differential amplifier and an alternating current (AC) biasing components;
    providing a differential amplifier output based on a voltage difference of inputs of the differential amplifier;

generating a synchronous demodulator output voltage based on the differential amplifier output and a reference signal to indicate an open-wire condition;

providing the synchronous demodulator output voltage to a controller to determine the open-wire condition; and receiving a sensor input at the differential amplifier over a hi-side connection and a lo-side connection, wherein the hi-side connection is coupled to a negative square wave rail through a first bias resistor and the lo-side connection is coupled to a positive square wave rail through a second bias resistor;

wherein a frequency of the reference signal is equal to a frequency the positive square wave rail.

9. The method of claim 8, wherein the open-wire condition indicates at least one of an open-wire condition in the hi-side connection or an open-wire condition in the lo-side connection.

10. The method of claim 8, responsive to detecting the open-wire condition, providing the synchronous demodulator output voltage in a voltage range that is different than a normal operating voltage range of the circuit.

11. The method of claim 8, further comprising detecting the open-wire condition when the sensor is a locally-grounded source.

12. The method of claim 8, further comprising detecting the open-wire condition when the sensor is a floating-differential source.

13. The method of claim 8, wherein the sensor output is an alternating current (AC) sinusoidal signal or a direct current (DC) signal.

* * * * *